United States Patent [19]

Kamagata et al.

[11] 4,224,616
[45] Sep. 23, 1980

[54] LUMINESCENT ANALOG-DISPLAY DEVICE DRIVEN IN RESPONSE TO TWO OUT OF PHASE TIMING PULSES

[75] Inventors: Toshio Kamagata; Takao Kishino, both of Mobara, Japan

[73] Assignee: Futaba Denshi Kogyo K.K., Chiba, Japan

[21] Appl. No.: 925,681

[22] Filed: Jul. 17, 1978

[30] Foreign Application Priority Data

Sep. 22, 1977 [JP] Japan .................... 52-113249

[51] Int. Cl.² ........................... G06F 3/14
[52] U.S. Cl. ........................ 340/753; 340/754; 340/802; 340/805
[58] Field of Search ........... 340/753, 754, 802, 803, 340/805

[56] References Cited

U.S. PATENT DOCUMENTS

| | | | |
|---|---|---|---|
| 3,343,155 | 9/1967 | Pahlavan | 340/753 |
| 3,525,091 | 8/1970 | Lally | 340/753 |
| 3,922,666 | 11/1975 | Inami et al. | 340/753 |
| 3,934,241 | 1/1976 | Weigert | 340/753 |
| 4,060,801 | 11/1977 | Stein et al. | 340/753 |
| 4,060,975 | 12/1977 | Yamaguchi | 340/803 |

*Primary Examiner*—Marshall M. Curtis
*Attorney, Agent, or Firm*—Oblon, Fisher, Spivak, McClelland & Maier

[57] ABSTRACT

A luminescent analog-display device having a plurality of segment anodes adapted to emit light when bombarded with electrons and divided into a plurality of groups, control electrodes provided independently of one another for the respective groups, a section for generating first and second timing pulses out of phase with each other, sections for giving a driving signal in response to the first timing pulse to the segment anodes corresponding in number to the numerical value of the least significant digit of the numerical information to be displayed and for giving a driving signal to all the segment anodes in response to the second timing pulse, and sections for giving a driving signal in response to the first timing pulse to the control electrode corresponding to the group for representing the numerical value of the least significant digit of the numerical information and also for giving a driving signal in response to the second timing pulse to the control electrodes associated with the groups corresponding to the numerical value of the higher-column significant digits of the numerical information.

7 Claims, 9 Drawing Figures

LUMINESCENT ANALOG-DISPLAY DEVICE DRIVEN IN RESPONSE TO TWO OUT OF PHASE TIMING PULSES

BACKGROUND OF THE INVENTION

1. Field of the Invention

The present invention relates to a luminescent display device for analog display and, more particularly, to a luminescent analog-display device for displaying numerical information in an analog fashion, for instance, in the form of a bar graph or the like.

2. Description of the Prior Art

As one of the types of the analog display devices for indicating or displaying numerical information in the form of, for instance, a bar graph, there have been luminescent analog-display devices of the type using luminescent material which emits light when bombarded with thermions.

Such a luminescent analog display device is composed of a substrate of insulating material, a plurality of segment anodes provided on the substrate and arranged, for instance, rectilinearly and each coated with a luminescent material layer, a mesh-like control electrode, or control grid, provided above and in the vicinity of the segment anodes, and a filamentary cathode, or filament, provided above the control grid and adapted to emit thermions when heated, the segment anodes together with the control grid and filament forming a display section, in which an anode voltage is given selectively to the segment anodes so that the number of segment anodes to which the anode voltage is given corresponds to numerical information to be displayed, and thereby the segment anodes to which the anode voltage is selectively given emit light to display the numerical information in an analog fashion, for instance, in the form of a bar graph.

The above-mentioned luminescent analog-display device has advantages in that it can emit light of high-quality color and therefore can be used in a dark environment and in that it has no moving part and therefore is free of malfunctions due to mechanical vibrations or the like and high in response speed.

In order to drive the above-mentioned luminescent analog display device, the following driving systems are usually adopted:

In an example of the driving systems, a plurality of segment anodes each coated with a luminescent material layer are electrically connected independently of one another to external terminals through which an anode voltage is selectively given to the anode segments so that the amount of anode voltage corresponds to numerical information to be displayed, and thereby analog display is carried out in a static fashion.

According to the above-mentioned driving system, it is possible to make the segment anodes emit light by a relatively low anode voltage. However, it has disadvantages in that, as the number of segment anodes is increased for the purpose of increasing the quantity of display or improving the reading accuracy, the number of external terminals increases and also the number of driving circuits increases which give the segment anodes a driving voltage.

In another example of the driving systems, a number of segment anodes rectilinearly arranged and each coated with a luminescent material layer are divided into a plurality of groups each having a predetermined number of segment anodes so that the segment anodes arranged at the corresponding positions in the above groups are electrically connected in common and also are connected to external terminals respectively, and a plurality of control grids are provided independently of one another for the respective groups, each being connected to a separate external terminal. In this example, the above-mentioned control grids are scanned in regular succession and in a time-sharing manner, and a driving voltage corresponding to numerical information is given to the segment anodes in synchronization with the scanning signal for the control grid thereby to perform analog display.

According to the above-mentioned driving system, the number of the external terminals corresponds to the sum of the number of the segment anodes of each group and the number of the control grids provided for the respective groups. Therefore, even when the number of segment anodes of each group or the number of groups is increased, the increase of the number of external terminals can be minimized. Accordingly, fine and accurate display can be performed using a small number of external terminals. In this example, however, the increase of the number of groups will result in the decrease of the so-called duty factor, i.e., the ratio of the duration of light emission of each segment anode to the scanning period of the control grid. Therefore, the driving voltage given to the segment anode must be kept high to obtain the desired luminance.

BRIEF SUMMARY OF THE INVENTION

The present invention contemplates to eliminate the above-mentioned disadvantages of the prior art.

Therefore, it is an object of the present invention to provide a luminescent analog-display device very simple in circuit configuration.

It is another object of the present invention to provide a luminescent analog-display device which can always keep the duty factor as large as about $\frac{1}{2}$ to $\frac{1}{3}$ irrespective of the number of segment anodes contained in each group or the number of groups.

It is still another object of the present invention to provide a luminescent analog-display device which can be driven on a low voltage.

It is a further object of the present invention to provide a luminescent analog-display device which can minimize the number of external terminals connected to the display section.

According to the present invention, there is provided a luminescent analog-display device for displaying input numerical information in an analog fashion, having a multiplicity of segment anodes arranged in a predetermined direction and each coated with a luminescent material layer which emits light when bombarded with electrons, the segment anodes being divided into a plurality of consecutive groups each containing a predetermined number of segment anodes so that those disposed at corresponding positions in the groups are electrically connected in common respectively, and control electrodes provided for the respective groups, the device comprising a timing-pulse generating circuit for generating first and second pulses different in phase from each other, a selective segment-anode driving section for selectively giving a driving signal to the segment anodes in response to the first timing pulse so that the number of segment anodes to which the driving signal is given corresponds to the numerical value of the least significant digit of the numerical information to be displayed and for giving a driving signal to all the segment anodes in response to the second timing pulse, and a selective control-electrode driving section for giving a driving signal in response to the first timing pulse to the control electrode corresponding to the group for representing the numerical value of the least significant digit of the numerical information and also for giving a driving signal in response to the second timing pulse to the control electrodes associated with the groups containing all the segment anodes corresponding to the numerical value of the higher-column significant digits of the numerical information.

DESCRIPTION OF THE PREFERRED EMBODIMENTS

Now a preferred embodiment of the present invention will be hereinafter described with reference to FIGS. 1, 2, 3 and 4(a)–4(d).

Figure 1:
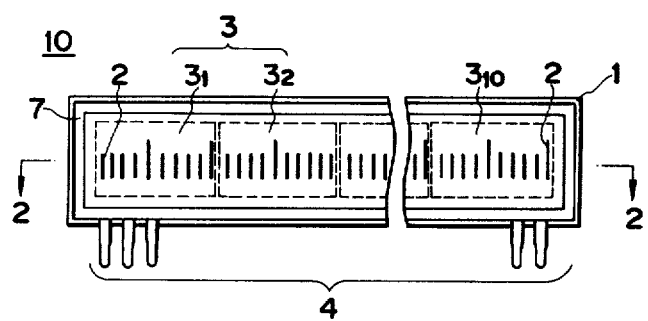
FIG. 1 shows an external appearance of the display section for use in a luminescent analog-display device according to a preferred embodiment of the present invention.
Figure 2:
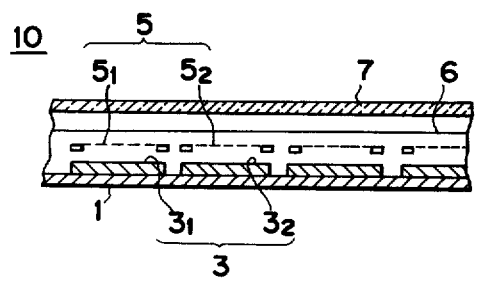
FIG. 2 is an enlarged fragmentary sectional view taken along lines 1—1 of FIG. 1.

As shown in FIGS. 1 and 2, reference numeral 10 generally designates a display section of a luminescent analog-display device according to a preferred embodiment of the present invention.

Reference numeral 1 designates a substrate made of insulating material such as glass or ceramics. On the upper surface of the substrate 1, there are provided a multiplicity of segment anodes 2 each coated with a luminescent material layer. The number of the segment anodes 2 is determined by the unit and quantity of display. The segment anodes 2 are divided into a plurality of groups 3 ($3_1$, $3_2$, ... $3_{10}$) each containing the same number of segment anodes 2. In addition, these segment anodes 2 are provided so that those disposed at corresponding positions in the groups 3 are electrically connected in common, respectively, and are also connected to external terminals, respectively. In the example shown in FIG. 1, the segment anodes 2 are arranged so that the distance therebetween corresponds to a numerical value "1" of the numerical information to be displayed and so that they are divided into ten groups 3($3_1$, $3_2$, ... , $3_{10}$) each containing ten segment anodes 2 thereby to display numerical values "1" to "100" in an analog fashion.

Above, opposite to and in the vicinity of the groups 3($3_1$, $3_2$, ... ), there are provided control electrodes, or grids, 5($5_1$, $5_2$, ... ) electrically independently of one another, respectively. The grids 5($5_1$, $5_2$, ... ) are connected to external terminals 4, respectively. A filamentary cathode 6, or a filament, common to all the groups 3 is provided above and opposite to the grids 5($5_1$, $5_2$, . . . ), being connected to an external terminal 4. The filament 6 is adapted to emit thermions when heated. In addition, a transparent front cover 7 is bonded to the substrate 1 through the peripheries thereof to form the casing of the display section 10 so that each external terminal is connected airtightly to the corresponding element inside the casing and so that a high vacuum state suitable for operation may be created and kept inside the casing.

In short, the display section 10 of the luminescent analog-display device according to the present invention is characterized in that the segment anodes 2 disposed at corresponding positions in the groups 3($3_1$, $3_2$, ... ) are electrically connected in common, respectively, and in that grids 5($5_1$, $5_2$, ... ) independent of one another are provided for the respective groups 3($3_1$, $3_2$, ... ). Accordingly, the total number of the external terminals 4 connected to the segment anodes 2 and grids 5 corresponds to the sum of the number of the segment anodes 2 in each group 3 and the number of the grids 5 provided for the respective groups 3. Thus, the number of the terminals 4 can be reduced to a minimum. Furthermore, even when the segment anodes 2 or the groups 3 are increased in number, the increase in the number of the external terminals 4 is equal to only the increase in the number of the grids 5 caused by the increase of the groups 3. As a result, the luminescent analog-display device according to the present invention can perform close and accurate display using a small number of external terminals.

Figure 3:
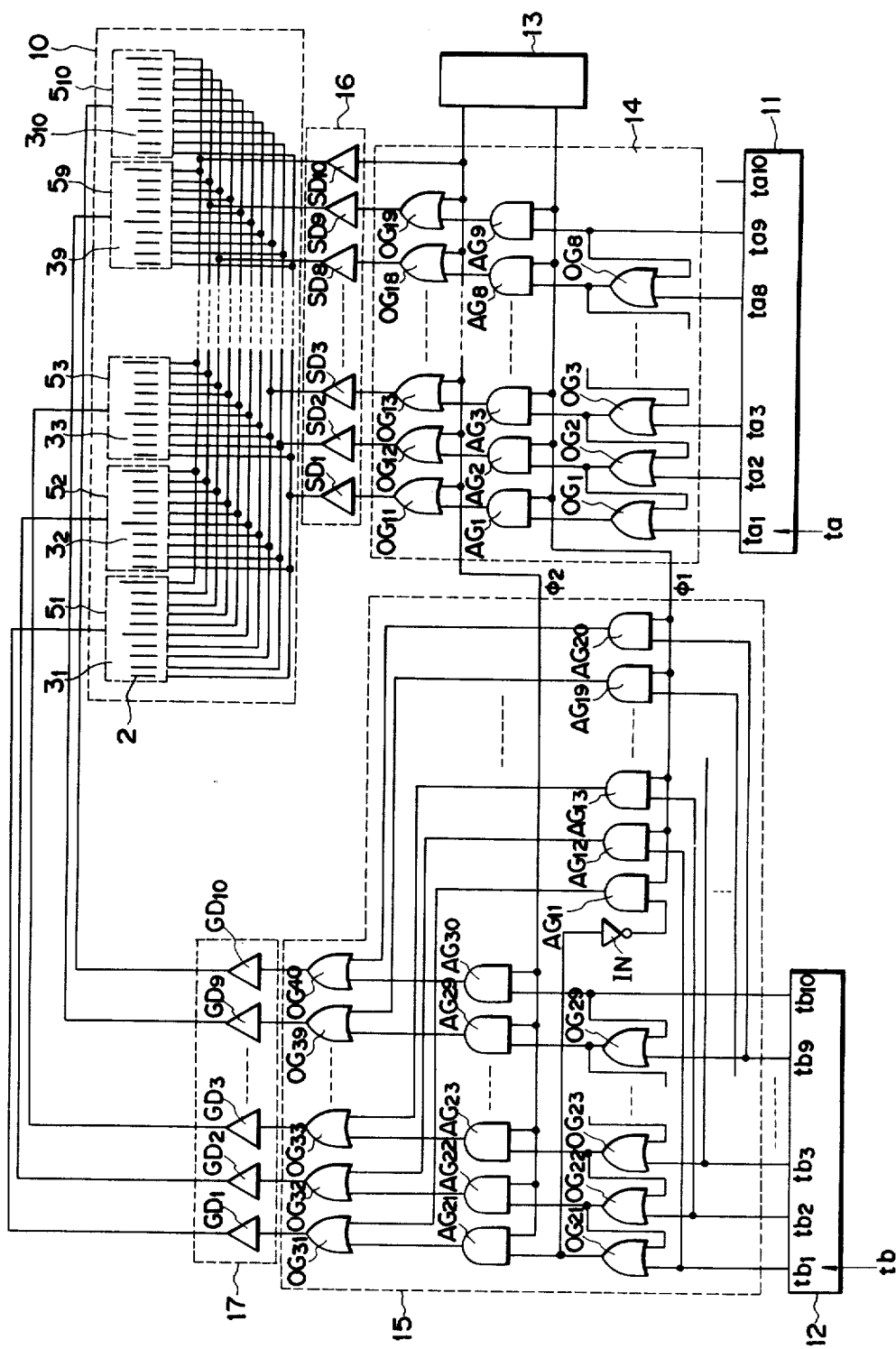
FIG. 3 shows a circuit configuration of the driving section of the above preferred embodiment.

FIG. 3 shows the driving section, or driver section, for driving the above-mentioned display section 10. The driving section will be hereinafter described with reference to FIG. 3.

Reference numeral 11 designates a first decoder for converting a numerical value corresponding to the least significant digit of a numerical information input given, for instance, by the BCD code into a decimal numeral so as to output a "1" signal from any one of terminals ta ($ta_1$, $ta_2$, ... , $ta_{10}$). Reference numeral 12 designates a second decoder for converting a numerical value of a higher-column digit or digits of the above-mentioned numerical information input into a decimal numeral so as to output a "1" signal from any one of terminals tb($tb_1$, $tb_2$, ... , $tb_{10}$).

Reference numeral 13 designates a timing-pulse generating section for generating two kinds of timing pulses $\phi_1$ and $\phi_2$ 180 deg. out of phase with each other as shown, for instance, in FIGS. 4(a) and 4(b). Reference numeral 14 designates a segment-anode selecting section for selecting, in synchronization with the first timing pulse $\phi_1$, from among the segment anodes 2 a certain number of them corresponding to the numerical value of the least significant digit of the numerical information decoded by the first decoder 11 and also for selecting all the segment anodes 2 in response to the second timing pulse $\phi_2$. The above segment-anode selecting section 14 is composed of two-input "or" circuits $OG_1$ to $OG_8$, two-input "and" circuits $AG_1$ to $AG_9$, and two-input "or" circuits $OG_{11}$ to $OG_{19}$. Reference numeral 15 designates a control-electrode selecting section, or a grid selecting section, for selecting, in response to the first timing pulse $\phi_1$, from among the grids 5 one grid corresponding to one group for displaying the numerical value of the least significant digit of the numerical information and also for selecting, in response to the second timing pulse $\phi_2$, the grids 5 corresponding to the groups for displaying the numerical value of the higher-column digit or digits of the numerical information. The grid selecting section 15 is composed of two-input "or" circuits $OG_{21}$ to $OG_{29}$, two-input "and" circuits $AG_{11}$ to $AG_{20}$ and $AG_{21}$ to $AG_{30}$, two-input "or" circuits $OG_{31}$ to $OG_{40}$, and an inverter IN.

Reference numeral 16 designates a segment-anode driving section for amplifying a segment-anode signal formed in the segment-anode selecting section 14 so as to give it to the selected segment anodes as a driving signal. The segment-anode driving section is composed of ten driver circuits $SD_1$ to $SD_{10}$.

Reference numeral 17 designates a grid driving section for amplifying a grid signal formed in the grid selecting section 15 so as to give it to the selected grid or grids as a driving signal. The grid-driving section 17 is composed of ten driver circuits $GD_1$ to $GD_{10}$ the output terminals of which are connected to the grids 5 of the display section 10, respectively.

With the above construction, the luminescent analog-display device according to the present invention may be operated as follows:

When the numerical value of the least significant digit of a numerical information input to be displayed is given to the first decoder 11 as a digital signal in the form of, for instance, the BCD code, the first decoder 11 converts this digital signal into a decimal numeral thereby to output a "1" signal from one of the terminals ta(ta$_1$, ta$_2$, ..., ta$_{10}$). For instance, if the numerical information input to be displayed is assumed to be "23", a "1" signal will appear on the output terminal ta$_3$ of the first decoder 11 when the first decoder 11 is given a BCD code signal "0011" corresponding to the numerical value "3" of the least significant digit of the numerical information input.

Meanwhile, the numerical value of the higher-column digit or digits of the numerical information input to be displayed is given to the second decoder 12. For instance, a BCD code signal "0010" corresponding to the numerical value "2" of the higher-column digit of the numerical value "23" is converted into a decimal numeral and thereby a "1" signal appears on the terminal tb$_2$ of the second decoder 12.

The "or" circuits $OG_1$ to $OG_8$ of the segment-anode selecting section 14 are connected, each at one of its input terminals, to the output terminals ta$_1$ to ta$_8$ of the first decoder 11, respectively. The "or" circuits $OG_1$ to $OG_7$ are connected, each at the other of its input terminals, to the output terminals of the "or" circuits $OG_2$ to $OG_8$ corresponding to digits positioned higher by one column, respectively. The "or" circuit $OG_8$ is connected, at the other of its input terminals, to the terminal ta$_9$ of the first decoder 11.

Accordingly, when a "1" signal is outputted from the terminal ta$_3$, "1" signals are outputted from the output terminals of all the "or" circuits $OG_1$ to $OG_3$. These "1" are given to the "and" circuits $AG_1$ to $AG_3$, each at one of its input terminals, respectively.

In addition, when a "1" signal is outputted from the terminal tb$_2$ of the second decoder 12, the "1" signal is given to one of the input terminals of the "and" circuit $AG_{13}$ of the grid selecting section 15.

In this case, a "1" signal is also outputted from the output terminal of the "or" circuit $OG_{22}$. Besides a "1" signal is outputted from the output terminal of the "or" circuit $OG_{21}$ which is connected, at the other of its terminals, to the output terminal of the "or" circuit $OG_{22}$. In addition, the output of the "or" circuit $OG_{21}$ is given to one of the input terminals of the "and" circuit $AG_{11}$ through the inverter IN, and thereby this input terminal of the "and" circuit $AG_{11}$ is kept in a "0" state. Accordingly, when the numerical value of the higher-column digit or digits of the numerical information input to be displayed is given to the second decoder 12, a "1" signal is given to one of the "and" circuits $AG_{11}$ to $AG_{20}$ at one of its input terminals.

When, in this state, a timing pulse $\phi_1$ is outputted from the timing-pulse generating section 13 as shown in FIG. 4(a), the timing pulse $\phi_1$ is given to the "and" circuits $AG_1$ to $AG_9$ of the segment-anode selecting section 14, each at the other of the input terminals, and also to the "and" circuits $AG_{11}$ to $AG_{20}$, each at the other of the input terminals. These input terminals are connected in common.

Consequently, in the segment-anode selecting section 14, the "or" circuits $OG_1$, $OG_2$, and $OG_3$ output "1" signals, respectively, when the numerical value "3" is given to the first decoder 11, and these output signals are given to the "and" circuits $AG_1$, $AG_2$ and $AG_3$, respectively, and therefore "1" signals are outputted from the output terminals of those "and" circuits, respectively. In response to these "1" signals, the "or" circuits $OG_{11}$, $OR_{12}$ and $OG_{13}$ output, at the output terminals thereof which coincide with the final output terminals of the segment-anode selecting section 14, "1" signals for period of tp$_1$ in synchronization with the timing pulse $\phi_1$ as shown in FIG. 4(c).

For the grid-selecting section 15, meanwhile, the numerical value "2" is given to the second decoder 12 the output of which is given, through its terminal, to the "and" circuit $AG_{13}$ as mentioned above, and therefore a "1" signal is outputted from the output terminal of the "and" circuit $AG_{13}$ as a result of logic operation. In response to this "1" signal, the "or" circuit $OG_{33}$ outputs, at the output terminal thereof which coincides with a final output terminal of the grid-selecting section 15, a "1" signal for a period of tp$_1$ in synchronization with the timing pulse $\phi_1$ as shown in FIG. 4(d).

During a period of tp$_1$ controlled by the timing pulse $\phi_1$, a "1" signal outputted from the "or" circuit $OG_{33}$ of the grid-selecting section 15 is amplified by the driver circuit $GD_3$ of the grid-driving section 17 so as to be given as a grid signal to the grid $5_3$ corresponding to the group $3_3$ which displays the numerical value of the least significant digit and is disposed at the third position as counted from the left end of the display section 10. Simultaneously, "1" signals outputted from the "or" circuits $OG_{11}$, $OG_{12}$ and $OG_{13}$ of the segment-anode selecting section 14 are amplified by the driver circuits $SD_1$, $SD_2$ and $SD_3$ so as to be given as driving signals to all the segment anodes disposed at the first to third positions of each group 3 as counted from the left end thereof.

Accordingly, in response to the timing pulse $\phi_1$, three segment anodes 2 contained in the group $3_3$ of the display section 10 are bombarded with thermions emitted from the filament 6 and thereby emit light.

Figure 4:
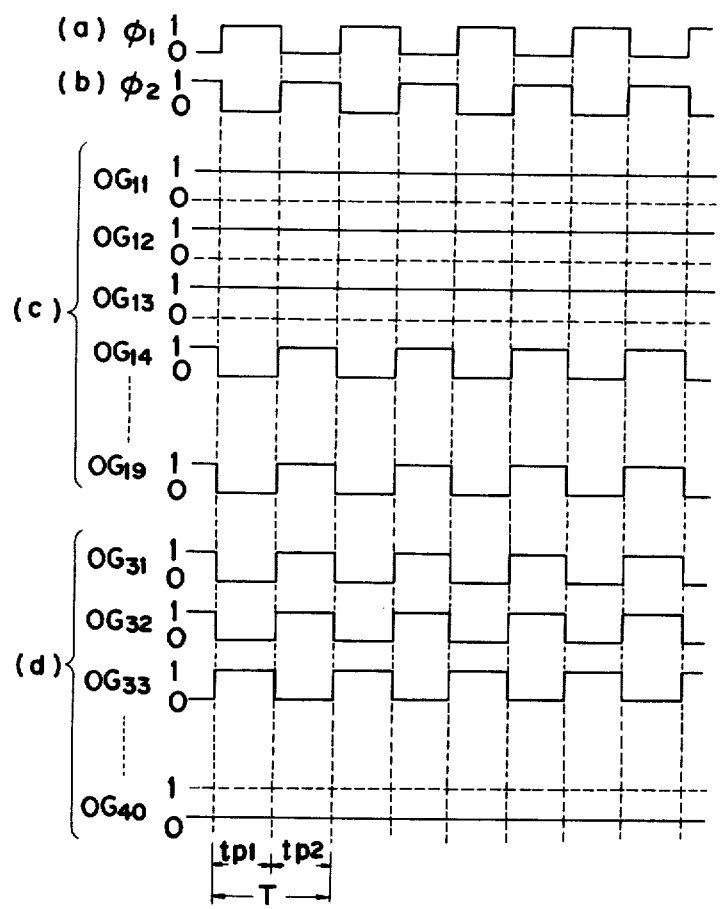
FIGS. 4(a) to 4(d) are timing diagrams for explaining the operation of the above preferred embodiment.

When a timing pulse $\phi_2$ is outputted from the timing-pulse generating section 13 as shown in FIG. 4 (b), the timing pulse $\phi_2$ is given to the "or" circuits $OG_{11}$ to $OG_{19}$, each at the other of its input terminals, to the input terminal of the driver circuit $SD_{10}$ of the segment-anode driving section 16, and to the "and" circuits $AG_{21}$ to $AG_{30}$ of the grid-selecting section 15, each at the other of its input terminals. These input terminals are connected in common.

Accordingly, all the "or" circuits $OG_{11}$ to $OG_{19}$ output, at the output terminals thereof, "1" signals for a period of $tp_2$ in synchronization with the timing pulse $\phi_2$ as shown in FIG. 4(c). These "1" signals and the timing pulse $\phi_2$ given directly to the driver circuit $SD_{10}$ are amplified by the respective driver circuits $SD_1$ to $SD_{10}$ of the segment-anode driving section 16 and thereby driving signals are given to all the segment anodes 2 of the display section 10.

In the case of the grid-selecting section 15, meanwhile, the numerical value "2" is given to the second decoder 12 and thereby "1" signals are outputted from the "or" circuits $OG_{21}$ and $OG_{22}$. The outputs of the "or" circuits $OG_{21}$ and $OG_{22}$ are introduced in the "and" circuits $AG_{21}$ and $AG_{22}$, each at one of its input terminals. Thus, the "and" circuits $AG_{21}$ and $AG_{22}$ output "1" signals as a result of logic operation. These "1" signals are given to the "or" circuits $OG_{31}$ and $OG_{32}$ which in turn output "1" signals for a period of $tp_2$ in synchronization with the timing pulse $\phi_2$ as shown in FIG. 4(d). These "1" signals are amplified by the driver circuits $GD_1$ and $GD_2$ of the grid-driving section 17, and thereby driving signals are given to the grids $5_1$ and $5_2$ of the display section 10.

Thus, driving signals are given to all the segment anodes 2 of the display section 10 and the grids $5_1$ and $5_2$ corresponding to the groups $3_1$ and $3_2$, respectively. In this manner, all the segment anodes 2 contained in the groups $3_1$ and $3_2$ are bombarded with thermions emitted from the filament 6 and thereby emit light.

As mentioned above, the segment anodes 2 contained in a selected group and corresponding in number to the numerical value of the least significant digit of a numerical information input to be displayed are first energized to emit light in response to the timing pulse $\phi_1$, and then the segment anodes 2 contained in the other group or groups selected according to the numerical information input are energized in response to the timing pulse $\phi_2$ to emit light. A series of these operations is repeated in response to the timing pulses $\phi_1$ and $\phi_2$, and thereby the numerical information input is displayed in the form of a bar graph in an analog fashion.

In this case, one display period T corresponds to the sum of the widths of the timing pulses $\phi_1$ and $\phi_2$, that is, $tp_1 + tp_2$. In one display period T, the segment anodes 2 emit light for a duration of $tp_1$ or $tp_2$.

Accordingly, if the width of the timing pulse $\phi_1$ is assumed to be identical to that of the timing pulse $\phi_2$, the duty factor of display will become as large as ½.

As mentioned above, the duty factor can be made high according to the present invention, and therefore it becomes possible to reduce the voltage levels given to the segment anodes 2 and the grids 5 to a mininum.

In general, the emission brightness or luminance of the luminescent analog-display device is proportional to the average power given to the segment anodes 2. Accordingly, when the segment anodes 2 are driven by a pulse signal, a small duty factor makes it necessary to increase the peak value of the voltage given to the segment anodes 2 in order to keep the above-mentioned average power constant and therefore necessitates a power supply for generating a high voltage.

However, as mentioned above, the luminescent analog-display device according to the present invention can make the duty factor as high as ½ thereby enabling a low-voltage driving.

In addition, the above-mentioned duty factor is kept constant irrespective of the number of groups 3 and that of segment anodes 2 contained in each group 3. According to the present invention, low-voltage driving can be performed even when the number of segment anodes 2 contained in each group 3 is increased in order to perform close and accurate display or when the number of groups 3 is increased.

In the preferred embodiment shown in FIG. 3, no input signal is given to the second decoder 12, if the numerical information to be displayed consists of only the numerical value of the least significant digit. In this case, "0" signals are outputted from the terminals $tb_1$ to $tb_{10}$ of the second decoder 12. As a result, all the "and" circuits $AG_{21}$ to $AG_{30}$ of the grid-selecting section 15 are kept in the "off" state. Meanwhile, since the output of the "or" circuit $OG_{21}$ is "0", the "and" circuit $AG_{11}$ to which the "0" output of the "or" circuit $OG_{21}$ is given after inversion by the inverter IN is kept in the "on" state. Therefore, the timing pulse $\phi_1$ generated from the timing-pulse generating section 13 is fed to the driver circuit $GD_1$ of the grid-driving section 17 through the "and" circuit $AG_{11}$ and the "or" circuit $OG_{31}$. In the driver circuit $GD_1$, the timing pulse $\phi_1$ is amplified and thereby is given to the grid $5_1$ of the display section 10 as a driving signal.

Accordingly, when, in response to the timing pulse $\phi_1$, the segment-selecting section 14 has formed a driving signal for segment anodes 2 corresponding in number to the numerical value given to the first decoder 11 and when the driving signal has been given to the segment anodes 2 through the segment-anode driving section 16, the segment anodes 2 corresponding in number to the numerical value given to the first decoder 11 are energized to emit light thereby to perform analog display in the form of a bar graph.

If the numerical value of the least significant digit of the numerical information to be displayed is assumed to be "0", no "1" signal will be outputted from the terminals $ta_1$ to $ta_9$ of the first decoder 11. In this case, therefore, the "and" circuits $AG_1$ to $AG_9$ are all in the "off" state. As a result, a driving signal is given to all the segment anodes 2 in response to the timing pulse $\phi_2$ and also a driving signal is given to the grids 5 selected according to the numerical value given to the second decoder 12. Thus, the segment anode 2 corresponding in number to the numerical information are energized for analog display in the form of a bar graph.

In addition, if the numerical information to be displayed is "100", a "1" signal will be outputted from the terminal $tb_{10}$ of the second decoder 12. In this case, this "1" signal causes all the outputs of the "or" circuits $OG_{21}$ to $OG_{29}$ to become "1" and thereby the "and" circuits $AG_{21}$ to $AG_{30}$ are all kept in the "on" state. Accordingly, if the timing pulse $\phi_2$ is outputted from the timing-pulse generating section 13, a driving signal is given to all the grids 5 of the display section 10 through the grid-driving section 17, while a driving signal is given to all the segment anodes 2 of the display section 10 through the segment-anode driving section 16. Thus, all the segment anodes 2 of the display section 10 are energized to emit light thereby to display the numerical value "100" in the form of a bar graph.

In this manner, the preferred embodiment of the present invention shown in FIG. 3 can display the numerical information "1" to "100" with a duty factor of ½.

In the above-mentioned preferred embodiment shown in FIG. 3, only the segment anodes 2 are adapted to emit light in the display section 10. However, in order to make it easy to read the quantities displayed by the emission of the segment anodes, a read section consisting of numeric characters and/or marks each coated with a luminescent material layer may be provided in the vicinity of the final segment anode 2 of each group 3.

Figure 5:
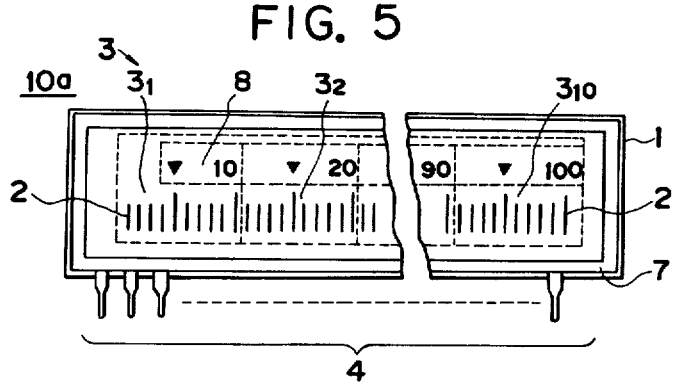
FIG. 5 shows an external appearance of the display section for use in a luminescent analog-display device according to another preferred embodiment of the present invention.

In the preferred embodiment shown in FIG. 5, a display section 10a provided with a read section 8 is formed. This read section 8 consists of conductors electrically connected together throughout all the groups 3 and each coated with a luminescent material layer in the form of a numeric character or a mark, the conductors being connected to an external terminal 4.

Figure 6:
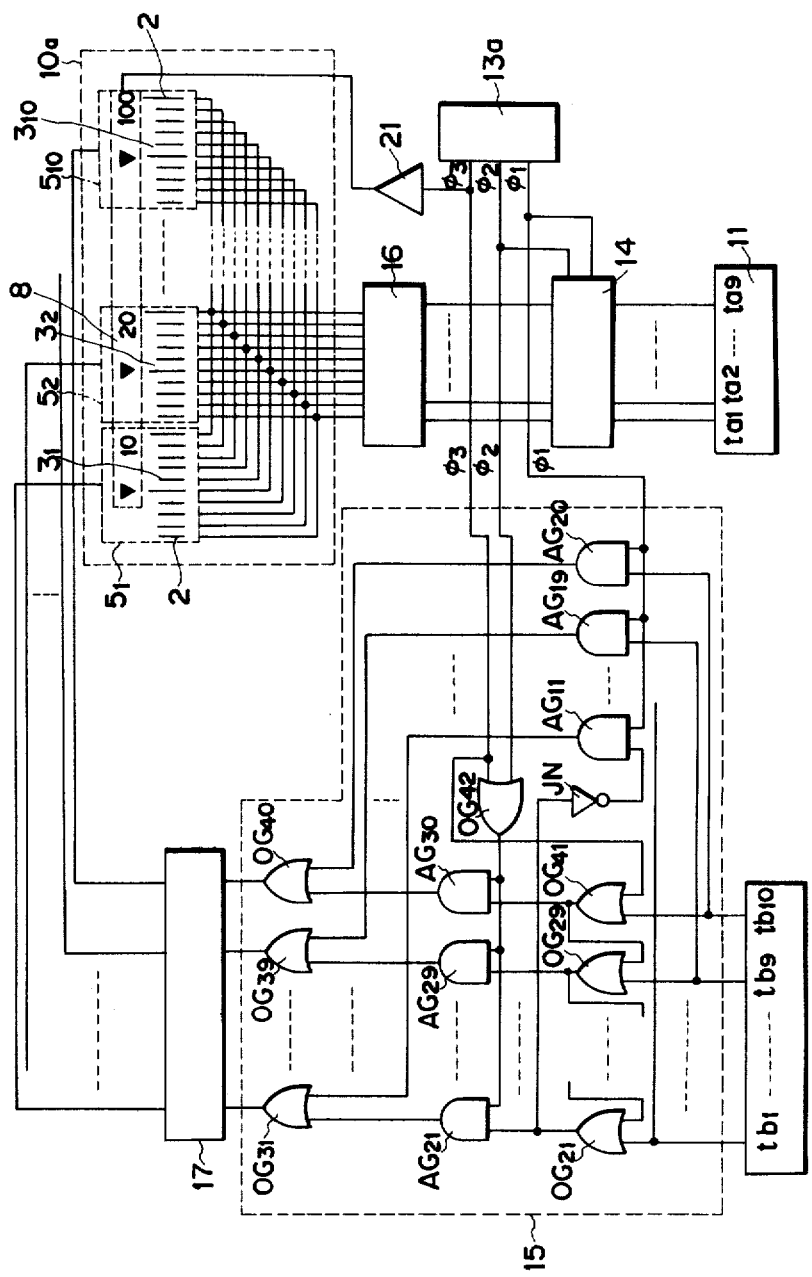
FIG. 6 shows a circuit configuration of the essential part of the driving section according to the above another preferred embodiment of the present invention.

The display section 10a shown in FIG. 5 may be driven by various systems. FIG. 6 shows an example of these systems.

In FIG. 6, only the essential portion of the driving system is shown and like reference characters designate the parts corresponding to those of the system shown in FIG. 3. A timing pulse generating section 13a is adapted to emit timing pulses $\phi_1$ and $\phi_2$ and, in addition, a timing pulse $\phi_3$ out of phase with the timing pulses $\phi_1$ and $\phi_2$ and used for timing the selective energizing of the read section 8. In addition to a segment-anode driving section 16, there is provided a driving section 21 for receiving and amplifying the timing pulse $\phi_3$ so as to produce a driving signal for the read section 8. In the grid-selecting section 15, there is provided an "or" circuit $OG_{41}$ which receives at one of its input terminals the output of the terminal $tb_{10}$ of the second decoder 12 and at the other of its input terminals the timing pulse $\phi_3$, and which produces an output to be fed to the input terminals of the "and" circuit $AG_{30}$ and "or" circuit $OG_{28}$. In addition, there is provided an "or" circuit $OG_{42}$ whose input terminals receive the timing pulse $\phi_2$ and $\phi_3$, respectively, and whose output terminal is connected to the "and" circuits $AG_{21}$ to $AG_{30}$, each at the other of its input terminals. These input terminals are electrically connected together.

In operation, the timing pulse $\phi_3$ is generated after the segment anodes 2 are energized to perform analog display in response to the timing pulses $\phi_1$ and $\phi_2$ according to the numerical information given to the first and second decoders 11 and 12. The timing pulse $\phi_3$ is first amplified in the driving section 21 so as to be given to the read section 8 a driving signal. Simultaneously, the timing pulse $\phi_3$ is fed to the "or" circuits $OG_{41}$ and $OG_{42}$ to cause the outputs of the "or" circuits $OG_{21}$ to $OG_{29}$ and $OG_{41}$ to become "1", and thereby a "1" signal is given to the "and" circuits $AG_{21}$ to $AG_{30}$, each at one of its input terminals. This "1" signal together with the "1" signal outputted from the "or" circuit $OG_{42}$ causes all the outputs of the "and" circuits $AG_{21}$ to $AG_{30}$ to become "1" as a result of logic operation.

Accordingly, a driving signal is given to all the grids 5 of the display section 10 through the "or" circuits $OG_{31}$ to $OG_{40}$ and the grid-driving section 17. Thus, the read section 8 is bombarded with thermions emitted from the filament 6 and thereby the numeric characters and/or marks are displayed.

According to the preferred embodiment of the present invention, the segment anodes 2 corresponding in number to the numerical information and the read section 8 for showing the quantity of display are energized to emit light with a duty factor of $\frac{1}{3}$. Thus, the reading of the quantities of the display becomes very easy.

In the example shown in FIG. 6, the grid-selecting section 15 provided for displaying the numerical information input is also used for giving a driving signal to the grid or grids 5 corresponding to the read section 8. However, a grid-selecting section for selecting the grid or grids 5 corresponding to the read section 8 so as to drive the read section 8 may be provided separately from the grid-selecting section 15 to form a read-section selecting section together with the driving section 21.

In addition, the information to be displayed in response to the third timing pulse $\phi_3$ is not limited to numeric characters or marks for making it easy to read the quantities displayed by the segment anodes 2. It may include any information such as the kinds of display quantity and units.

In the preferred embodiment shown in FIG. 3, the timing pulse $\phi_2$ is outputted immediately after the timing pulse $\phi_1$. However, a so-called blanking time may be provided between the timing pulses $\phi_1$ and $\phi_2$ in order to prevent leakage emission of light during a transient period of display, as a matter of course.

Moreover, it is possible to display any numerical value more than "100" in an analog fashion by increasing the numbers of the "or" and "and" circuits of the second decoder 12 and grid-driving section 15 and the number of driving circuits of the grid-driving section 17.

It will be understood from the foregoing description that the luminescent analog-display device according to the present invention has the following distinguished features, advantages and effects:

The numerical information to be displayed is divided into two parts: the numerical value of the least significant digit and that of the higher-column digit or digits. If necessary, means may be provided for displaying additional information associated with the numerical information.

These information inputs are selectively displayed in response to the timing pulses out of phase with one another. Thus, the numerical information can be displayed in an analog fashion with a duty factor of as large as $\frac{1}{2}$ or $\frac{1}{3}$ irrespective of the number of segment anodes and the number of groups of the segment anodes.

Accordingly, analog display with a desired brightness can be obtained using a low driving voltage, and therefore the need for a special power supply device or ciruit for generating a high voltage is eliminated. In addition, the circuit design and configuration of the driving section is very much simplified, and thereby direct driving using LSI becomes possible, for instance.

Furthermore, the number of external terminals connected to the elements of the display section can be reduced to a minimum as in the case of the conventional display section of the dynamic drive type. Thus, the display section is very easy to produce.

In addition, since the duty factor is very large, flickering of the display is eliminated thereby improving the quality of display.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. In a luminescent analog-display device for displaying a numerical information input in an analog fashion, having a multiplicity of segment anodes arranged in a predetermined direction and each coated with a luminescent material layer which emits light when bombarded with electrons, said segment anodes being divided into a plurality of consecutive groups each containing a predetermined number of the segment anodes, said segment anodes being provided so that those disposed at corresponding positions in said groups are electricaly connected in common respectively, and control electrodes provided independently of one another for the respective groups, the improvement which comprises a timing-pulse generating section for generating first and second timing pulses out of phase with each other, segment-anode selecting and driving sections for selectively giving a driving signal in response to said first timing pulse so that the number of the segment anodes to which the driving signal is given corresponds to the numerical value of the least significant digit of said numerical information input and for giving a driving signal to all of said segment anodes in response to said second timing pulse, and control-electrode selecting and driving sections for giving a driving signal in response to said first timing pulse to the control electrode corresponding to the group for representing the numerical value of the least significant digit of said numerical information input and also for giving a driving signal in response to said second timing pulse to the control electrodes associated with the groups containing all the segment anodes corresponding to the numerical value of the higher-column significant digits of said numerical information input.

2. In a luminescent analog-display device for displaying a numerical information input in an analog fashion, having a multiplicity of segment anodes arranged in a predetermined direction and each coated with a luminescent material layer which emits light when bombarded with electrons, a read section for displaying additional information, said segment anodes being divided into a plurality of consecutive groups each containing a predetermined number of the segment anodes, said segment anodes being provided so that those disposed at corresponding positions in said groups are electrically connected in common respectively, and control electrodes provided independently of one another for the respective groups, the improvement which at least comprises a timing-pulse generating section for generating first, second and third timing pulses out of phase with one another, segment-anode selecting and driving sections for selectively giving a driving signal in response to said first timing pulse so that the number of the segment anodes to which the driving signal is given corresponds to the numerical value of the least significant digit of said numerical information input and for giving a driving signal to all of said segment anodes in response to said second timing pulse, control-electrode selecting and driving sections for giving a driving signal in response to said first timing pulse to the control electrode corresponding to the group for representing the numerical value of the least significant digit of said numerical information input and also for driving a signal in response to said second timing pulse to the control electrodes associated with the groups containing all the segment anodes corresponding to the numerical value of the higher-column significant digits of said numerical information input, and read-section selecting and driving sections for giving a driving signal to said read section in response to said third timing pulse and for giving a driving signal to the control electrodes corresponding to said read section.

3. A luminescent analog-display device for displaying a numerical information input in an analog fashion as in claim 1 wherein one display period corresponds to the sum of the width of said first and said second timing pulses; said segment anodes emitting light for the duration of one display period.

4. A luminescent analog-display device for displaying a numerical information input in an analog fashion as in claim 3 wherein the width of said first timing pulse is identical to that of said second timing pulse to thereby impart to said display device a duty factor of ½.

5. A luminescent analog-display device for displaying a numerical information input in an analog fashion as in claim 4 wherein the magnitude of said duty factor permits a corresponding decrease in the level of voltage applied to said segment anodes and to said control electrodes; said duty factor being maintained constant irrespective of the number of consecutive groups of said segment anodes being driven in said display device.

6. A luminescent analog-display device for displaying a numerical information input in an analog fashion as in claim 4 wherein the magnitude of said duty factor eliminates flickering of said display device to thereby improve the display quality thereof.

7. A luminescent analog-display device for displaying a numerical information input in an analog fashion as in claim 2 wherein said segment anodes corresponding in number to the numerical information to be displayed and said read section are energized to emit light with a duty factor of ⅓ to thereby improve display quality.

* * * * *